(12) United States Patent
Schwandner

(10) Patent No.: US 8,501,028 B2
(45) Date of Patent: Aug. 6, 2013

(54) METHOD FOR GRINDING A SEMICONDUCTOR WAFER

(75) Inventor: Juergen Schwandner, Garching (DE)

(73) Assignee: Siltronic AG, Munich (DE)

( * ) Notice: Subject to any disclaimer, the term of this patent is extended or adjusted under 35 U.S.C. 154(b) by 282 days.

(21) Appl. No.: 12/894,468

(22) Filed: Sep. 30, 2010

(65) Prior Publication Data
US 2011/0081836 A1   Apr. 7, 2011

(30) Foreign Application Priority Data

Oct. 7, 2009   (DE) .......................... 10 2009 048 436

(51) Int. Cl.
*B44C 1/22* (2006.01)

(52) U.S. Cl.
USPC .................. 216/89; 216/88; 216/90; 216/91; 216/92; 438/689; 438/690; 438/691; 438/692; 438/693; 257/E21.214

(58) Field of Classification Search
None
See application file for complete search history.

(56) References Cited

U.S. PATENT DOCUMENTS

| | | | |
|---|---|---|---|
| 3,905,162 A | 9/1975 | Lawrence et al. | |
| 5,400,548 A | 3/1995 | Huber et al. | |
| 6,220,928 B1 | 4/2001 | Okabe et al. | |
| 6,899,762 B2 | 5/2005 | Wenski et al. | |
| 7,713,107 B2 | 5/2010 | Sekiya et al. | |
| 7,815,489 B2 | 10/2010 | Pietsch et al. | |
| 2001/0014570 A1* | 8/2001 | Wenski et al. | 451/41 |
| 2002/0055324 A1* | 5/2002 | Wenski et al. | 451/41 |
| 2002/0115387 A1* | 8/2002 | Wenski et al. | 451/41 |
| 2008/0014839 A1* | 1/2008 | Pietsch et al. | 451/41 |
| 2009/0011683 A1 | 1/2009 | Junge et al. | |

FOREIGN PATENT DOCUMENTS

| | | |
|---|---|---|
| CN | 1254441 A | 5/2000 |
| CN | 1720353 A | 1/2006 |
| DE | 10046933 A1 | 4/2002 |
| DE | 10344602 A1 | 5/2005 |
| DE | 102006032455 A1 | 4/2008 |
| DE | 102007030958 A1 | 1/2009 |
| EP | 0955126 B1 | 10/2002 |
| JP | 0992632 A | 4/1997 |
| JP | 2003504223 A | 2/2003 |
| JP | 2003249466 A | 9/2003 |
| JP | 2004148411 A | 5/2004 |
| JP | 2005223344 A | 8/2005 |
| KR | 20010021223 A | 3/2000 |

(Continued)

OTHER PUBLICATIONS

H. Xiao, Introduction to Semiconductor Manufacturing Technology, published by Prentice Hall, 2001, ISBN 0-13-022404-9, p. 519.*

(Continued)

*Primary Examiner* — Lan Vinh
*Assistant Examiner* — Jiong-Ping Lu
(74) *Attorney, Agent, or Firm* — Leydig, Voit & Mayer, Ltd.

(57) ABSTRACT

A method for processing a semiconductor wafer includes bringing at least one grinding tool in contact with the semiconductor wafer; removing material from the semiconductor wafer using the grinding tool; disposing a liquid medium having a viscosity of at least $3 \times 10^{-3}$ N/m²·s and at most $100 \times 10^{-3}$ N/m²·s between the at least one grinding tool and the semiconductor wafer; and separating the at least one grinding tool and the semiconductor wafer so as to end the processing.

16 Claims, 1 Drawing Sheet

FOREIGN PATENT DOCUMENTS

| | | |
|---|---|---|
| KR | 20020077190 A | 10/2002 |
| KR | 20080007165 A | 1/2008 |
| WO | WO 9849723 A1 | 11/1998 |
| WO | 0105555 A1 | 1/2001 |
| WO | WO 2004055864 A3 | 1/2005 |

OTHER PUBLICATIONS

Weast, R. C. (Ed.): "CRC Handbook of Chemistry and Physics", 56th Ed., CRC Press, Boca Raton.

* cited by examiner

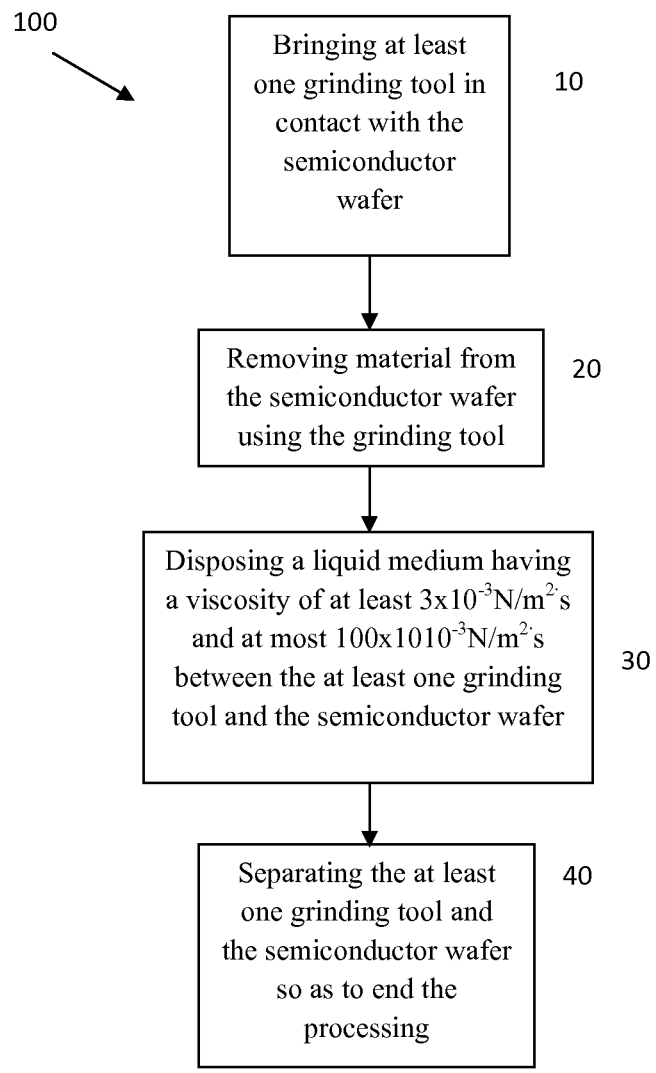

METHOD FOR GRINDING A SEMICONDUCTOR WAFER

CROSS REFERENCE TO PRIOR APPLICATIONS

Priority is claimed to German Application No. DE 10 2009 048 436.1, filed Oct. 7, 2009, the entire disclosure of which is incorporated by reference herein.

FIELD

The invention relates to a method for grinding a semiconductor wafer.

BACKGROUND

The mechanical processing of the semiconductor wafer serves for removing sawing undulations, removing the surface layers that were damaged in crystalline fashion by the rougher sawing processes or were contaminated by the sawing wire, and primarily for global leveling of the semiconductor wafers. Surface grinding (single-side, double-side) and lapping are known here, and also mechanical edge processing steps.

In the case of single-side grinding, the semiconductor wafer is held on the rear side on a support ("chuck"), and leveled on the front side by a cup grinding disk with rotation of support and grinding disk and slow radial delivery. Methods and apparatuses for the surface grinding of a semiconductor wafer are known from U.S. Pat. No. 3,905,162 and U.S. Pat. No. 5,400,548 or EP-0955126, for example. In this case, a semiconductor wafer is fixedly held by one surface thereof on a wafer holder, while its opposite surface is processed by means of a grinding disk by virtue of the fact that wafer holder and grinding disk rotate and are pressed against one another. In this case, the semiconductor wafer is fixed on the wafer holder in such a way that its center substantially corresponds to the rotation center of the wafer holder. Moreover, the grinding disk is positioned in such a way that the rotation center of the semiconductor wafer reaches a working region or the edge region formed by teeth of the grinding disk. As a result, the entire surface of the semiconductor wafer can be ground without any movement in the grinding plane.

In the case of simultaneous double-side grinding ("double-disk grinding", DDG), the semiconductor wafer is simultaneously processed on both sides in a manner floating freely between two grinding disks mounted on opposite colinear spindles, and in the process is guided in a manner substantially free of constraining forces axially between a water cushion (hydrostatic principle) or air cushion (aerostatic principle) acting on the front and rear sides, and is prevented from floating away radially loosely by a surrounding thin guide ring or by individual radial spokes.

During the grinding processes—this applies to both single-side and double-side grinding methods, it is necessary to cool the grinding tool and/or the processed semiconductor wafer. Water or deionized water is conventionally used as a coolant. Commercial grinding machines, such as e.g. the models DFG8540 and DFG8560 ("Grinder 800 Series") from Disco Corp., which are suitable for grinding wafers having diameters of 100-200 mm and 200-300 mm, respectively, are equipped at the factory with a vacuum unit which ensures a constant coolant flow rate of 1 or 3 l/min (=liters per minute) during grinding, depending on the coolant temperature (constantly 1 l/min at a temperature of less than 22° C., constantly 3 l/min at a temperature of greater than 22° C.).

Double-side grinding machines are also available from Koyo Machine Industries Co., Ltd., for example. The model DXSG320 is suitable e.g. for the DDG grinding of wafers having a diameter of 300 mm. Both vertical and horizontal spindles are employed in combination with special diamond grinding tools. These grinding tools are designed such that they cut only with the edge and combine a rapid advance rate with little evolution of heat. The semiconductor wafer to be processed is fixed by hydrostatic pressure pads from both sides in a transport ring. The wafer is driven merely by means of a small lug which engages into the orientation notch of the semiconductor wafer. Stress-free mounting of the semiconductor wafer can be ensured in this way.

In the case of lapping, the semiconductor wafers are moved under a specific pressure with supply of a slurry containing abrasive materials between an upper and a lower working disk, which are usually composed of steel and normally provided with channels for better distribution of the lapping agent, whereby semiconductor material is removed. However, lapping is not part of the subject matter of the present invention.

DE 103 44 602 A1 and DE 10 2006 032 455 A1 disclose methods for the simultaneous grinding at the same time of both sides of a plurality of semiconductor wafers with a movement sequence similar to that of lapping, but characterized by the fact that abrasive is used which is fixedly bonded in working layers ("films", "pads") applied to the working disks. During processing, the semiconductor wafers are inserted into thin guide cages, so-called carriers, which have corresponding openings for receiving the semiconductor wafers. The carriers have an outer toothing which engages into a rolling apparatus comprising inner and outer toothed rings and are moved by means of said rolling apparatus in the working gap formed between upper and lower working disks. The carriers have openings through which coolant can be exchanged between lower and upper working disks, such that upper and lower working layers are always at the same temperature.

All the grinding methods mentioned leave behind significantly pronounced damage on the semiconductor wafer. Damage should be understood to mean crystal damage near the surface on account of the mechanical processing ("subsurface damage"). Scratches and other mechanically caused defects on the surface of the semiconductor wafer after grinding also constitute such damage. This crystal damage has to be eliminated by means of subsequent etching methods. However—as is known to a person skilled in the art—these etching methods adversely influence the geometry, in particular the edge geometry and the nanotopology, of the semiconductor wafer. On account of the poor nanotopology after etching, longer removal polishing processes are necessary in order to achieve the desired nanotopology.

Therefore, a person skilled in the art endeavors to minimize the damage after grinding and to be able to provide, after grinding, a semiconductor wafer having optimum geometry and nanotopology, but primarily with significantly less damage. This would allow the etching process possibly to be able to be dispensed with entirely. Primarily, however, a shorter process time could be made possible during polishing since, rather than correcting the nanotopology, obtaining an optimum surface roughness is to the fore.

DE 102007030958 claims a method for grinding semiconductor wafers, wherein the semiconductor wafers are processed in material-removing fashion on one side or on both sides by means of at least one grinding tool, with a coolant being supplied in each case into a contact region between semiconductor wafer and the at least one grinding tool, wherein a coolant flow rate is chosen in each case depending on a grinding tooth height of the at least one grinding tool and said coolant flow rate is reduced as the grinding tooth height decreases, whereby a constant cooling of the contact region between workpiece and grinding tool can be achieved by virtue of the fact that the coolant accumulates in front of the grinding teeth, flows around the latter and is swirled into the contact region between workpiece and grinding tool depending on the height of the grinding teeth. According to DE 102007030958, the amount of coolant which reaches said contact region is crucial for the grinding result ("subsurface damage"), and also the service life of the grinding tool.

What is disadvantageous about the method described in DE 102007030958 is the fact that the height of the grinding teeth has to be measured throughout the grinding process in order to be able to correspondingly adapt the coolant flow rate. This is because DE 102007030958 proceeds from a significantly increased coolant flow rate by comparison with the standard process, which coolant flow rate must also therefore be reduced as the tooth height decreases since an unchanged high coolant flow rate would otherwise unavoidably lead to aquaplaning effects.

For PPG, the method described in DE 102007030958 cannot be applied anyway since the grinding tools employed are not toothed grinding disks ("toothed wheels") but rather working disks comprising working layers with abrasives bonded therein.

SUMMARY OF THE INVENTION

An aspect of the invention was to find a novel grinding method which avoids the disadvantages of the prior art.

BRIEF DESCRIPTION OF THE DRAWING

The single FIGURE shows a flowchart schematically illustrating an embodiment of the method of the present invention.

DETAILED DESCRIPTION

The FIGURE shows a method 100 for polishing a semiconductor wafer. At least one grinding tool and the semiconductor wafer are brought in contact (10). Material is removed from the semiconductor wafer using the grinding tool (20). A liquid medium having a viscosity of at least $3 \times 10^{-3}$ N/m$^2$·s and at most $100 \times 10^{-3}$ N/m$^2$·s is disposed between the at least one grinding tool and the semiconductor wafer (30). The at least one grinding tool and the semiconductor wafer are separated so as to end the processing (40).

In an embodiment a method is provided for processing a semiconductor wafer, wherein at least one grinding tool and a side surface of at least one semiconductor wafer are delivered to one another, whereby material is removed from the at least one semiconductor wafer, wherein a liquid medium having a viscosity of at least $3 \cdot 10^{-3}$ N/m$^2$·s and at most $100 \cdot 10^{-3}$ N/m$^2$·s is situated between the at least one grinding tool and the at least one semiconductor wafer, while the at least one grinding tool and the at least one semiconductor wafer are removed from one another in order to end the processing operation.

The invention provides for modifying a conventional grinding step, which can be single-side grinding or double-side grinding, in such a way that, toward the end of the grinding step, a medium having increased viscosity is added in order to curb the mechanical removal by the grinding tools during single-side or double-side grinding. Apart from the process of removing grinding tool and semiconductor wafer in the course of ending the grinding process, grinding is not effected using viscosity-increasing media or additives since, firstly, it is more expedient to effect grinding using media of low viscosity, e.g. water without additives or with additives of low viscosity (coolant), during the actual removal grinding process and, secondly, the "grinding swarf" that arises during the process is transported away better by said media of low viscosity and the cutting capacity of the grinding tool is maintained. It is precisely the cutting capacity of the grinding tool that is intended to be attenuated or even eliminated by the addition of a medium having an increased viscosity by comparison with water in the course of ending the grinding.

Semiconductor wafers processed in this way exhibit no grinding striae, no lift-off marks (lift-off of the grinding disk toward the end of the conventional single-side grinding) and no grinding scratches after grinding.

The viscous medium is supplied toward the end of the processing of the semiconductor wafer.

In the case of single-side grinding, the medium is introduced between semiconductor wafer and grinding tool before semiconductor wafer and grinding tool are removed from one another after the grinding processing has ended after a specific material removal has been attained, by virtue of the grinding tool being led back at a return speed.

In the case of simultaneous double-side grinding (DDG), an analogous procedure is adopted: before the semiconductor wafer and the two grinding tools are removed from one another after the grinding processing has ended, the medium is introduced between semiconductor wafer and grinding tools.

Both in the case of single-side grinding and in the case of double-side grinding, the medium is introduced via the center of the grinding tools. The grinding tools usually have openings in order to enable the grinding tool and/or the processed semiconductor wafer to be cooled. Water or deionized water is conventionally used as a coolant. Toward the end of the processing operation, the medium that curbs the mechanical removal is introduced instead of the coolant.

In the case of grinding with lapping kinematics, the medium is introduced via openings in the carrier. In the prior art, these openings are provided for transporting coolant to the working disks via said openings. In the present invention, once again toward the end of the processing operation, the medium that curbs the mechanical removal is introduced instead of coolant through said openings in the carriers.

This shows that the method according to the invention necessitates no alterations whatsoever on the conventional grinding machines.

The choice of the medium that curbs the mechanical removal is crucial.

Said medium is a liquid medium having a viscosity of at least $3 \cdot 10^{-3}$ N/m$^2$·s and at most $100 \cdot 10^{-3}$ N/m$^2$·s (mPa·s). Preferably, the viscosity of the medium is $3$-$80 \cdot 10^{-3}$ N/m$^2$·s, particularly preferably $3$-$60 \cdot 10^{-3}$ N/m$^2$·s and especially preferably $3$-$40 \cdot 10^{-3}$ N/m$^2$·s.

As is known, the viscosity is a measure of the viscousness of a fluid. The reciprocal of the viscosity is the fluidity, a measure of the flowability of a fluid. The greater the viscosity, the more viscous (less flowable) the fluid; the lower the viscosity, the less viscous (more flowable) the fluid.

Preferably, the medium comprises polyhydric alcohols (polyhydric in the sense of "more than one hydroxyl group").

Preferably, the polyhydric alcohol is selected from the group consisting of glycerol, monomeric glycols, oligomeric glycols, polyglycols and polyalcohols.

The presence of more than one hydroxyl group results in more possibilities for forming hydrogen bridge bonds, that is to say stronger intermolecular interactions, which ultimately lead to an increased viscosity.

Preferably, the medium comprises small amounts of surfactants.

Preferably, the medium contains polyhydric alcohols, polyalcohols and surfactants.

Preferably, the medium contains short- or longer-chain polyethylene glycols, sols or gels.

Preferably, the medium comprises glycerol.

Preferably, the medium comprises polyetherpolyol and polyvinyl alcohol.

The use of glycerol-water mixtures is especially preferred.

Table 1 shows the change in the viscosity of a glycerol-water mixture at a temperature of 20° C. for various glycerol proportions (data inter alia according to: WEAST, R. C. [Ed.]: "CRC Handbook of Chemistry and Physics", 56th Ed., CRC Press, Boca Raton).

Pure glycerol has a viscosity of up to 1500 mPa·s at room temperature and is used to increase the viscosity of deionized water, which is only approximately 1 mPa·s, to 3-100 mPa·s in a targeted manner.

TABLE 1

Viscosity of a glycerol-water mixture at 20° C.

| Glycerol proportion: | Viscosity in mPa · s |
|---|---|
| 100% by weight | 1760 |
| 92% by weight | 354 |
| 88% by weight | 130 |
| 84% by weight | 71 |
| 80% by weight | 48 |
| 50% by weight | 6 |
| 0% by weight | 1 |

Preferably, the glycerol proportion is approximately 50-85% by weight at a temperature of 20° C.

Furthermore, the viscosity is greatly temperature-dependent: for pure glycerol, the viscosity is approximately 1.760 Pa·s at T=20° C. and decreases to approximately 0.934 Pa·s at T=25° C. The viscosity of pure water is also temperature-dependent.

When glycerol-water mixtures are used, consideration should therefore be given to supplying the medium at a temperature of 20° C.

If the medium is intended to be at a significantly higher temperature, it is preferred for the glycerol proportion to be increased beyond 85% by weight in order to ensure the desired viscosity.

Preferably, the medium is an aqueous mixture composed of glycerol, butanol and a surfactant.

The use of slurries is also particularly preferred, wherein the required viscosity of the medium is ensured by the solids proportion.

The slurries can be used both in combination with the viscosity-increasing mixtures described above and in pure form, that is to say e.g. in the form of a conventional silica sol, without addition of a viscosity-increasing component, wherein the required viscosity in this case is set by a suitable choice of the concentration of the dissolved sol particles.

The use of such slurries is associated with an additional effect. The surface roughness of the processed surface(s) can be reduced by the sol particles having a precision-mechanical effect. This holds true particularly when relatively high concentrated slurries are used. In order to prevent drying on or crystallization out and associated subsequent encrustation of the media-supplying lines, it is recommendable after the end of the grinding step—particularly when highly concentrated sols are used for stopping the typical removal grinding—for these to be purged by thorough rinsing with water.

The use of colloidal dispersions composed of silicon dioxide or cerium oxide particles is preferred.

An aqueous colloidally dispersed solution of amorphous silicon dioxide comprises silicon dioxide in the form of mutually uncrosslinked spherical individual particles containing hydroxyl groups at the surface.

The viscosity of these slurries comprising spatially uncrosslinked particles is a function of the concentration and the particle size or the specific surface area.

The viscosity can be determined exactly by means of delivery pipettes or falling-ball viscometers, for example. The viscosity of the mixture or slurry is preferably measured prior to the use thereof in the method according to the invention.

The viscosity is usually higher for smaller particles. The viscosity increases as the solids content by volume increases such that the particles are packed more closely and restricted in terms of their free mobility (internal friction). In addition, interactions and collisions between the individual particles increase.

Slurries having a relatively low solids content by volume behave approximately like Newtonian fluids.

The viscosity is independent of the shear rate.

Preferably, slurries comprising particles which have a narrow size distribution are used. The average particle size is preferably 5-50 nm.

The solids proportion of silicon dioxide or cerium oxide is preferably greater than 1% by weight up to at most 50% by weight.

If a reduction of the surface roughness of the processed surface(s) of the semiconductor wafer is desired, a solids proportion of 20-50% by weight is preferred.

At lower solids proportions of from 1 to less than 20% by weight, the viscosity is preferably increased by one of the abovementioned viscosity-modifying additives such as glycerol, for example.

The supply of the medium that curbs the mechanical removal ensures that less subsurface damage, in particular no lift-off marks, no pronounced grinding striae and no pronounced grinding scratches result on the semiconductor wafer. This is owing to the fact that the medium that has a higher viscosity than water reduces the mechanical force action on the surface of the semiconductor wafer toward the end of the grinding process.

Lift-off marks occur in the prior art particularly after DDG and are critical for geometry and nanotopology. Grinding striae occur in the case of single-side grinding in accordance with the prior art and they likewise adversely influence geometry and nanotopology. Scratches can occur in all grinding methods in accordance with the prior art and are critical for geometry and the surface properties of the semiconductor wafer.

These defects can be completely eliminated by the method according to the invention.

As already mentioned above, the method can be carried out on all machine types with planar plates and corresponding media distributors.

For double-side face grinding with planetary kinematics (lapping kinematics), conventional double-side polishing machines are suitable, wherein corresponding grinding pads (working layers of the working disks) are used instead of polishing pads without abrasives.

Particularly preferred process parameters for carrying out the method are presented below.

Single-side grinding:
Grinding disk with a fine grain size #2000 or finer (with diamond, CeO2, Al2O3, SiC or BaCO3 as abrasive)
Rotational speed of the grinding disk 1000-5000 rpm, particularly preferably 2000-4000 rpm
Rotational speed of the semiconductor wafer 50-300 rpm, particularly preferably 200-300 $\text{min}^{-1}$
Advancing speed 10-20 μm/min
Coolant: water 0.1-5 l/min
Toward the end of processing, supply of a liquid medium having a viscosity of at least $3 \cdot 10^{-3}$ N/m$^2$·s and at most $100 \cdot 10^{-3}$ N/m$^2$·s at 0.1-5 l/min, particularly preferably 3-5 l/min Double-Side Grinding:
Granulation of the grinding disks 4-50 μm, diamond as abrasive (ceramically or metallically bonded)
Spindle rotational speed of 1000-12000 rpm, particularly preferably 4000-8000 rpm
Spindle delivery rate of 15-300 μm/min (relative to both spindles)
Rotational speed of the semiconductor wafer of 5-100 rpm, particularly preferably 25-50 rpm
Cooling lubrication with water of 0.1-5 l/min
Toward the end of processing, supply of a liquid medium having a viscosity of at least $3 \cdot 10^{-3}$ N/m$^2$·s and at most $100 \cdot 10^{-3}$ N/m$^2$·s at 0.1-5 l/min, particularly preferably 3-5 l/min By way of example, an aqueous mixture composed of butanol, glycerol and a surfactant is suitable for supplying a liquid medium having a viscosity of at least $3 \cdot 10^{-3}$ N/m$^2$·s and at most $100 \cdot 10^{-3}$ N/m$^2$·s. The volumetric flow rate of the medium is 5 liters/min. The glycerol proportion is 1% by weight, and the butanol proportion is 1% by weight. In addition, a surfactant was added with a proportion of 0.07% by weight. The surfactant is a preparation based on alkylbenzenesulfonic acid and amine ethoxylate.

The addition of silica sol with an SiO$_2$ concentration of 30% by weight as a viscous protective layer on the semiconductor wafer toward the end of the grinding process is likewise suitable.

What is claimed is:

1. A method for processing a semiconductor wafer comprising:
   bringing at least one grinding tool in contact with the semiconductor wafer;
   removing material from the semiconductor wafer using the grinding tool during a grinding process;
   disposing a liquid medium having a viscosity of at least $3 \times 10^{-3}$ N/m$^2$·s and at most $100 \times 10^{-3}$ N/m$^2$·s between the at least one grinding tool and the semiconductor wafer; and
   toward the end of the grinding process adding silica sol between the at least one grinding tool and the semiconductor wafer while separating the at least one grinding tool and the semiconductor wafer so as to end the grinding process.

2. The method as recited in claim 1, wherein the liquid medium includes a polyhydric alcohol.

3. The method as recited in claim 2, wherein the polyhydric alcohol is selected from the group consisting of glycerol, monomeric glycols, oligomeric glycols, polyglycols and polyalcohols.

4. The method as recited in claim 2, wherein a proportion of the polyhydric alcohol in the liquid medium is 0.01 to 10% by volume.

5. The method as recited in claim 1, wherein the liquid medium includes glycerol.

6. The method as recited in claim 5, wherein the liquid medium is a glycerol-water mixture having a glycerol proportion of 50%-85%.

7. The method as recited in claim 1, wherein the liquid medium includes polyether polyol and polyvinyl alcohol.

8. The method as recited in claim 1, wherein the liquid medium includes small amounts of surfactants.

9. The method as recited in claim 1, wherein the liquid medium is an aqueous mixture containing glycerol, butanol and a surfactant.

10. The method as recited in claim 1, wherein the liquid medium includes solids in a form of one of silicon dioxide and cerium oxide particles.

11. The method as recited in claim 10, wherein an average particle size of the silicon dioxide and the cerium oxide is 5-50 nm.

12. The method as recited in claim 10, wherein a proportion of the solids is greater than 1% by weight and at most 50% by weight.

13. The method as recited in claim 12, wherein the proportion of the solids is 1-30% by weight.

14. The method as recited in claim 1, further comprising fixedly holding the semiconductor wafer by a first surface of the wafer using a wafer holder, wherein the at least one grinding tool includes a grinding disk and wherein the removing the material is performed by processing a second surface of the wafer using the grinding disk, the wafer and the grinding disk rotating and being pressed against one another, and wherein the disposing the liquid medium is performed by introducing the liquid medium between the grinding disk and the semiconductor wafer via an opening in the grinding disk.

15. The method as recited in claim 1, wherein the at least one grinding tool includes two grinding tools mounted on opposite collinear spindles, and wherein the removing the material includes processing a first and a second side of the semiconductor wafer simultaneously, the semiconductor wafer floating freely between the two grinding tools, the processing guided in a manner substantially free of constraining forces axially between a water or air cushion acting on the first and second sides, and wherein the disposing the liquid medium is performed by introducing the liquid medium between the grinding disk and the semiconductor wafer via an opening in the grinding disk.

16. A method for processing a plurality of semiconductor wafers simultaneously comprising:
   disposing each of the plurality of semiconductor wafers in a cutout of a respective one of a plurality of carriers, each semiconductor wafer lying in a freely movable manner in a cutout in one of a plurality of carriers;
   rotating each of the plurality of carriers using a ring-shaped outer drive ring and a ring-shaped inner drive ring on a cycloidal trajectory;
   disposing the plurality of semiconductor wafers between rotating ring-shaped working disks having working layers;
   removing material from each of the plurality of semiconductor wafers using the working layers of the working disks during a grinding process;
   disposing a liquid medium between the working disks and the plurality of semiconductor wafers via an opening in the carriers, the liquid medium having a viscosity of at least $3 \times 10^{-3}$ N/m$^2$·s and at most $100 \times 10^{-3}$ N/m$^2$·s; and
   toward the end of the grinding process adding silica sol between the working disks and the semiconductor wafers while separation the working disks and the semiconductor wafers so as to end the grinding process.

\* \* \* \* \*